(12) United States Patent
Yan et al.

(10) Patent No.: US 12,289,960 B2
(45) Date of Patent: Apr. 29, 2025

(54) DISPLAY PANEL AND DISPLAY DEVICE

(71) Applicant: BOE TECHNOLOGY GROUP CO., LTD., Beijing (CN)

(72) Inventors: Huajie Yan, Beijing (CN); Zhiqiang Jiao, Beijing (CN); Lu Wang, Beijing (CN); Xiaohu Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 532 days.

(21) Appl. No.: 17/642,988

(22) PCT Filed: May 14, 2021

(86) PCT No.: PCT/CN2021/093898
§ 371 (c)(1),
(2) Date: Mar. 15, 2022

(87) PCT Pub. No.: WO2021/233229
PCT Pub. Date: Nov. 25, 2021

(65) Prior Publication Data
US 2022/0310726 A1    Sep. 29, 2022

(30) Foreign Application Priority Data
May 22, 2020  (CN) .......................... 202010441851.5

(51) Int. Cl.
*H01L 21/78*    (2006.01)
*H10K 50/856*   (2023.01)
(Continued)

(52) U.S. Cl.
CPC ......... *H10K 59/122* (2023.02); *H10K 50/856* (2023.02); *H10K 50/858* (2023.02);
(Continued)

(58) Field of Classification Search
CPC .. H10K 59/122; H10K 50/856; H10K 50/858; H10K 71/00; H10K 50/115;
(Continued)

(56) References Cited

U.S. PATENT DOCUMENTS 7,453,426 B2 * 11/2008 Yamazaki .............. H10K 59/35
345/80
9,136,308 B2 * 9/2015 Pasveer .................. H10K 65/00
(Continued)

FOREIGN PATENT DOCUMENTS

CN    101603665 A    12/2009
CN    105789256 A    7/2016
(Continued)

OTHER PUBLICATIONS

International Search Report and Written Opinion issued Aug. 12, 2021, in International Application No. PCT/CN2021/093898.
(Continued)

*Primary Examiner* — Vu A Vu
(74) *Attorney, Agent, or Firm* — XSENSUS LLP

(57) ABSTRACT

A display panel comprises a driving substrate (1), a light-emitting layer (2) and a light guide layer (3); the light-emitting layer (2) is arranged on one side of the driving substrate (1) and comprises a plurality of front light-emitting units (21) and a plurality of rear light-emitting units (22), each of the rear light-emitting units (22) comprising a light source part (221) and a light extracting part (222), and the front light-emitting units (21) and the light source parts (221) being configured for emitting light towards a side away from the driving substrate (1); and the light guide layer (3) comprises a plurality of light guide parts (31), each light guide part (31) being configured to guide light emitted by the light source part (221) of a corresponding rear light-emitting unit (22) to the light extracting part (222).

11 Claims, 4 Drawing Sheets

(51) Int. Cl.
  *H10K 50/858* (2023.01)
  *H10K 59/122* (2023.01)
  *H10K 71/00* (2023.01)
  *H10K 50/115* (2023.01)
  *H10K 59/12* (2023.01)

(52) U.S. Cl.
  CPC ........... *H10K 71/00* (2023.02); *H10K 50/115* (2023.02); *H10K 59/1201* (2023.02)

(58) Field of Classification Search
  CPC ............. H10K 59/1201; H10K 50/865; H10K 2102/3031; H10K 59/12
  USPC .......................................................... 257/40
  See application file for complete search history.

(56) References Cited

U.S. PATENT DOCUMENTS

| | | | | |
|---|---|---|---|---|
| 9,173,272 | B2 * | 10/2015 | Lee | ........................ G09G 3/3225 |
| 9,685,492 | B2 * | 6/2017 | Kim | ...................... H10K 59/128 |
| 9,997,574 | B2 * | 6/2018 | Yang | ........................ H10K 59/65 |
| 10,593,904 | B2 * | 3/2020 | Gao | ........................ H10K 50/814 |
| 10,672,346 | B2 * | 6/2020 | Kang | ...................... H01L 27/124 |
| 10,909,900 | B2 | 2/2021 | Luan et al. | |
| 11,289,564 | B2 * | 3/2022 | Feng | ........................ H10K 50/865 |
| 2017/0271417 | A1 | 9/2017 | Jia et al. | |
| 2020/0168144 | A1 | 5/2020 | Luan et al. | |

FOREIGN PATENT DOCUMENTS

| | | |
|---|---|---|
| CN | 106783913 A | 5/2017 |
| CN | 1073432302 A | 11/2017 |
| CN | 108400155 A | 8/2018 |
| CN | 109300968 A | 2/2019 |
| CN | 110391283 A | 10/2019 |
| CN | 111564570 A | 8/2020 |
| JP | 2006-302748 A | 11/2006 |
| JP | 4677822 B2 | 4/2011 |

OTHER PUBLICATIONS

Chinese Office Action issued Aug. 8, 2022, in Chinese Application 202010441851.5.

* cited by examiner

DISPLAY PANEL AND DISPLAY DEVICE

CROSS-REFERENCE TO RELATED APPLICATIONS

The present application is a national phase application under 35 U.S.C. § 371 of International Application No. PCT/CN2021/093898, filed on May 14, 2021, which is based upon, and claims the benefit of and priority to, Chinese Patent Application No. 202010441851.5, entitled "display panel and display device," filed on May 22, 2020, where the contents of both of which are incorporated by reference in their entireties herein.

TECHNICAL FIELD

The present disclosure relates to the field of display technology and, in particular, to a display panel and a display device.

BACKGROUND

The display panel is an indispensable part of electronic equipment such as mobile phones, computers, and TVs. At present, the display panel usually only emits light to one side to display the image.

It should be noted that, information disclosed in the above background part is provided only for better understanding of the background of the present disclosure, and thus it may contain information that does not form the prior art known by those ordinary skilled in the art.

SUMMARY

The present disclosure provides a display panel and display device which can realize double-sided display.

According to one aspect, the present disclosure provides a display panel including:
 a driving substrate having a light-transmitting structure;
 a light-emitting layer, disposed at a side of the driving substrate and including a plurality of front light-emitting units and a plurality of rear light-emitting units, wherein each rear light-emitting unit includes a light source part and a light extracting part, and the front light-emitting units and the light source part are configured to emit light to a side away from the driving substrate; and
 a light guide layer, disposed at a side of the light-emitting layer away from the driving substrate and including a plurality of light guide parts, wherein each light guide part is disposed in a one-to-one correspondence with each rear light-emitting unit, and each light guide part is configured to guide light emitted by the light source part of corresponding rear light-emitting unit to the light extracting part, to extract light to the driving substrate by the light extracting part.

In an example embodiment of the present disclosure, an orthographic projection of the each light guide part on the driving substrate is positioned between the light source part and the light extracting part of the corresponding rear light-emitting unit, and
 the light guide layer includes a plurality of first refractive layers sequentially distributed along a direction away from the driving substrate, and a second refractive layer is attached between two adjacent first refractive layers,
 wherein a ratio of a refractive index of the second refractive layer to a refractive index of the first refractive layer is not less than $\sqrt{2}$.

In an example embodiment of the present disclosure, the light guide layer is disposed on the side of the light-emitting layer away from the driving substrate, and
 the display panel further includes:
 an encapsulation layer covering the light guide layer and the light-emitting layer; and
 a light shielding layer disposed on a side of the encapsulation layer away from the driving substrate and including a plurality of light shielding parts, wherein each rear light-emitting unit is located within an orthographic projection of each light-shielding part on the driving substrate in a one-to-one correspondence, and each front light-emitting unit is located outside the orthographic projection of each light-shielding part on the driving substrate.

In an example embodiment of the present disclosure, the display panel further includes:
 a cover plate, disposed at the side of the light-emitting layer away from the driving substrate,
 wherein the light guide layer is disposed at a surface of the cover plate close to the driving backplate, and each light guide part includes a light guide groove extending toward the corresponding rear light-emitting unit, the light guide groove includes a first groove wall and a second groove wall that are reflective and disposed opposite to each other, the first groove wall is configured to reflect at least part of light emitted by the light-emitting part to the second groove wall, and the second groove wall is configured to reflect at least part of light from the first groove wall to the light extracting part.

In an example embodiment of the present disclosure, an included angle between the first groove wall and the cover plate and an included angle between the second groove wall and the cover plate are both 45°, the light source part is disposed within an orthographic projection of the first groove wall on the driving substrate while outside an orthographic projection of the second groove wall on the driving substrate, and the light extracting part is disposed within the orthographic projection of the second groove wall on the driving substrate while outside the orthographic projection of the first groove wall on the driving substrate.

In an example embodiment of the present disclosure, the light guide part includes:
 a support layer, disposed at a surface of the light-emitting layer close to the cover plate and having a groove extending towards the corresponding rear light-emitting unit; and
 a reflective layer, overlapped on side walls of the groove, and wherein the light guide groove is formed by the reflective layer.

In an example embodiment of the present disclosure, the light source is configured to emit light of a first color, and the rear light-emitting units includes a first rear light-emitting unit, a second rear light-emitting unit and a third rear light-emitting unit,
 wherein the light extracting part of the first rear light-emitting unit is in a light-transmitting structure, and the light extracting part of the second rear light-emitting unit and the light extracting part of the third rear light-emitting unit both include a photoluminescent layer excitable by the by the light of the first color to emit light, and the light emitted by the photoluminescent layer of the second rear light-emitting unit and the light emitted by the photoluminescent layer of the third rear light-emitting unit have different colors.

In an example embodiment of the present disclosure, each front light-emitting unit includes a first front electrode, a front light-emitting functional layer and a second front electrode sequentially stacked in a direction away from the driving substrate, and each rear light-emitting unit includes a first rear electrode, a rear light-emitting functional layer and a second rear electrode stacked in sequence in the direction away from the driving substrate, wherein the first front electrode and the first rear electrode are reflective, and the second front electrode and the second rear electrode are transitive, and wherein the light-emitting layer includes:
a first electrode layer, disposed on a same side of the driving substrate as the photoluminescent layer, wherein the first electrode is reflective and includes the first front electrode and the first rear electrode;
a pixel defining layer, disposed on a same side of the driving substrate as the first electrode layer and exposing the first front electrode, the first rear electrode, and the photoluminescent layer, wherein the a through hole is formed in the pixel defining layer at an area corresponding to the first rear light-emitting unit;
a light-emitting functional layer, overlapped on the first electrode layer and the pixel defining layer and including the front light-emitting functional layer and the rear light-emitting functional layer; and
a second electrode layer, overlapped on the light-emitting functional layer, the first electrode layer and the photoluminescent layer and extended into the through hole, wherein the second electrode layer is transitive and including the second front electrode and the second rear electrode.

In an example embodiment of the present disclosure, the photoluminescent layer includes quantum dot material.

According to an aspect of the present disclosure, there is provided a display device, wherein the display device includes anyone of the above display panel.

It is to be understood that both the foregoing general description and the following detailed description are exemplary and explanatory only and are not restrictive of the invention, as claimed.

BRIEF DESCRIPTION OF THE DRAWINGS

The accompanying drawings are enclosed and constitute a part of the specification, and together with the following detailed description, to serve for explanation of the present disclosure. Obviously, the drawings in the following description are only some embodiments of the present disclosure, and for those of ordinary skill in the art, other drawings can also be obtained from these drawings without creative effort.

DETAILED DESCRIPTION

Figure 1:
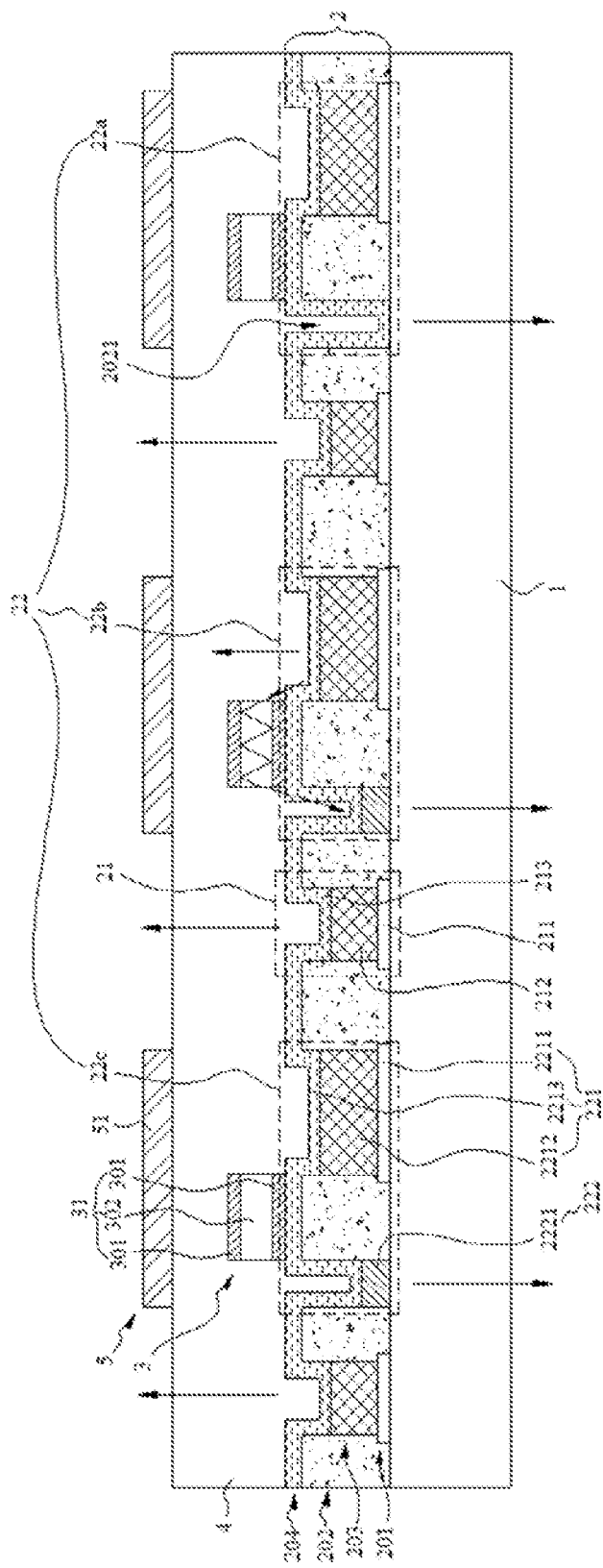
FIG. 1 is a schematic diagram of an implementation of the display panel of the present disclosure.

Example embodiments will now be described more fully with reference to the accompanying drawings. However, example embodiments can be embodied in various forms and should not be construed as limited to the embodiments set forth herein. Rather, these embodiments are provided so that this disclosure will be thorough and complete, and will fully convey the concept of example embodiments to those skilled in the art. The same reference numerals in the drawings denote the same or similar structures, and thus their detailed descriptions will be omitted. Furthermore, the drawings are merely schematic illustrations of the present disclosure and are not necessarily drawn to scale.

Although relative terms such as "upper" and "lower" are used in this specification to describe the relative relationship of one component to another component shown in the figures, these terms are used in this specification only for convenience, such as according to the direction of the example shown in the drawings. It will be appreciated that if the device of the icon is turned upside down, the components described as "upper" will become the "lower" components. When a certain structure is "on" other structures, it may mean that a certain structure is integrally formed on other structures, or that a certain structure is "directly" arranged on other structures, or that a certain structure is "indirectly" arranged on another structure through another structure.

The terms "a", "an", "the", "said", and "at least one" are used to indicate the presence of one or more elements/components/etc., and the terms "including" and "having" are used to indicate an open-ended inclusive and means that additional elements/components/etc. may be present in addition to the listed elements/components/etc., and the terms "first", "second", and "third" are used only as identifiers, not a limit on the number of its objects.

Figure 3:
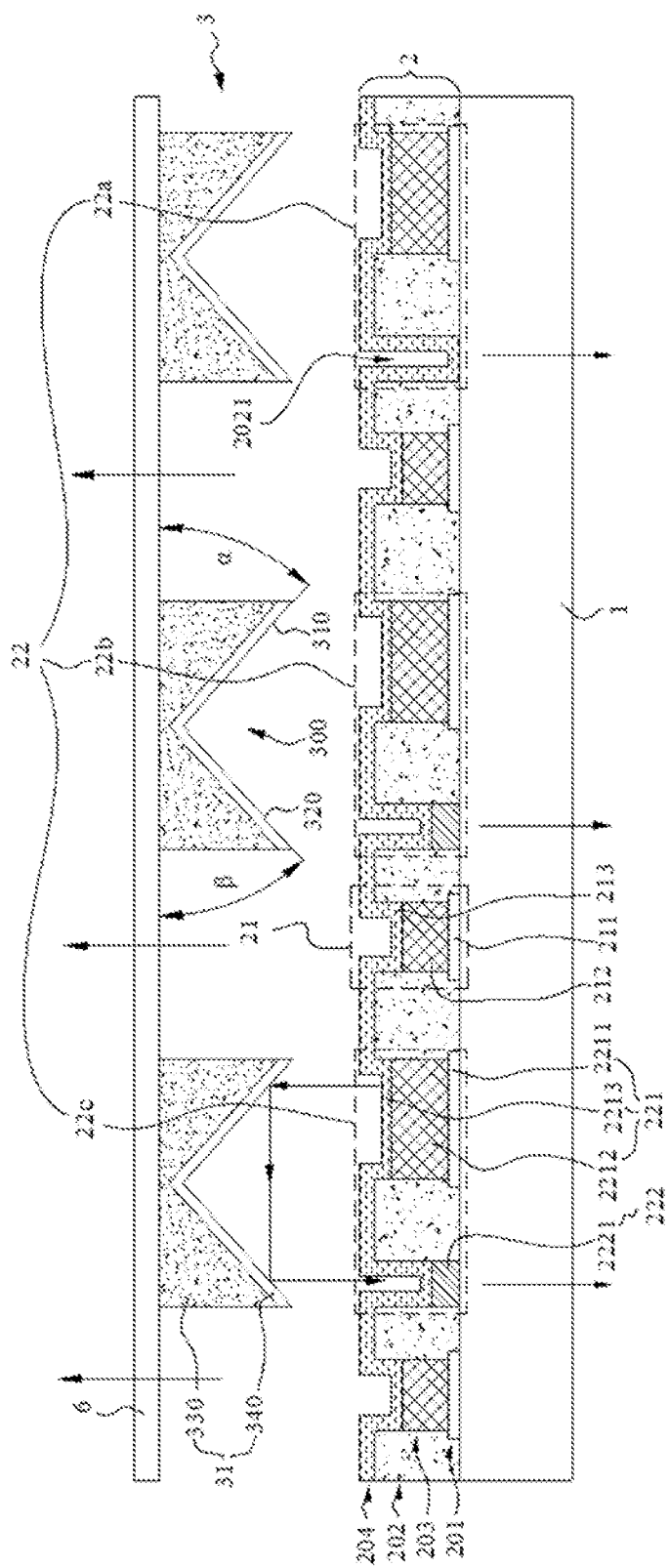
FIG. 3 is a schematic diagram of another implementation of the display panel of the present disclosure.

Embodiments of the present disclosure provides a display panel, as shown in FIGS. 1 and 3, the display panel includes a driving substrate 1, a light-emitting layer 2, and a light guide layer 3.

The driving substrate 1 has a light-transmitting structure.

The light-emitting layer 2 is arranged on one side of the driving substrate 1, and the light-emitting layer 2 includes a plurality of front light-emitting units 21 and a plurality of rear light-emitting units 22, and the rear light-emitting unit 22 includes a light source part 221 and a light extracting part 222. The front light-emitting units 21 and the light source part 221 are used to emit light to a side away from the driving substrate 1.

The light guide layer 3 is disposed on the side of the light-emitting layer 2 away from the driving substrate 1, and the light guide layer 3 includes a plurality of light guide parts 31. Each light guide part 31 is disposed in a one-to-one correspondence with each rear light-emitting unit 22, and each light guide part 31 is used to guide the light emitted by the light source part 221 of the corresponding rear light-emitting unit 22 to the light-emitting extracting 222, so that the light extracting part 222 extracts light to the drive substrate 1.

It should be noted that "front" and "rear" in the front light-emitting unit 21 and the rear light-emitting unit 22 are only used to distinguish light-emitting units that emit light in two different directions, and do not constitute a limitation on the actual light-emitting direction.

In the display panel of the embodiment of the present disclosure, the front light-emitting unit 21 can emit light to the side away from the driving substrate 1 so as to display an image. Meanwhile, for the rear light-emitting unit 22, the light emitted by the light source part 221 of the rear light-emitting unit 22 can be guided to the light extracting part 222 through the light-guiding part 31, and then propagated from the light extracting part 222 to the driving substrate 1. Since the driving substrate 1 has a light-transmitting structure, light can be emitted to the side of the driving substrate 1 away from the light-emitting layer 2, and images can also be displayed. Thereby, double-sided display can be realized, so that users on both sides of the display panel can see images at the same time.

Hereinafter, respective parts of the display panel of the present disclosure will be described in detail.

As shown in FIGS. 1 and 3, the driving substrate 1 can be used for driving the light-emitting layer 2 to emit light, and the driving substrate 1 may include a substrate and a plurality of pixel driving circuits on the substrate. The pixel driving circuits includes a plurality of first pixel driving circuits and a plurality of second pixel driving circuits. The first pixel driving circuits are connected to each front light-emitting unit 21 in a one-to-one correspondence, so as to drive the front light-emitting unit 21 to emit light. The second pixel driving circuits are connected to the rear light source parts 221 in a one-to-one correspondence, so as to drive the rear light-emitting units 22 to emit light. The specific structure of the pixel driving circuit is not particularly limited here, as long as it can be used to drive the light-emitting layer 2 to emit light.

Of course, the driving substrate 1 may further include other circuits such as a gate driving circuit, which cooperate with the pixel driving circuit to drive the light-emitting layer 2 to emit light, these circuits will not be listed herein.

In order to prevent the pixel driving circuit from blocking the rear light-emitting unit 22, the driving substrate 1 has a plurality of light-transmitting regions. The pixel driving circuits are located outside the light-transmitting area, and each light extracting part 222 of the rear light-emitting unit 22 is located in each light-transmitting area in a one-to-one correspondence.

As shown in FIGS. 1 and 3, the light-emitting layer 2 is provided on one side of the driving substrate 1, and the light-emitting layer 2 includes a plurality of front light-emitting units 21 and a plurality of rear light-emitting units 22.

Each front light-emitting unit 21 can be used to emit light to the side of the light-emitting layer 2 away from the driving substrate 1.

As shown in FIGS. 1 and 3, in some embodiments of the present disclosure, the front light-emitting unit 21 may be a top emission OLED (Organic Light-Emitting Diode) light-emitting device. The front light-emitting unit 21 includes a first front electrode 211, a front light-emitting functional layer 212, and a second front electrode 213 which are sequentially stacked in a direction away from the driving substrate 1. By applying a driving signal to the first front electrode 211 and the second front electrode 213, the front light-emitting functional layer 212 can emit light.

The first front electrode 211 includes reflective material. The front light-emitting functional layer 212 may include a hole injection layer, a hole transport layer, a light-emitting material layer, an electron transport layer, and an electron injection layer sequentially stacked in a direction away from the driving substrate 1. The second front electrode 213 includes transparent material.

The front light-emitting unit 21 can be used as a sub-pixel, all the front light-emitting units 21 can be classified into a plurality of pixels, and each pixel includes three sub-pixels with different colors, that is, three front light-emitting units 21 with different light emission colors. For example, the colors of the three front light-emitting units 21 of the same pixel are red, blue, and green, respectively.

As shown in FIGS. 1 and 3, the rear light-emitting unit 22 may include a light source part 221 and a light extracting part 222.

The light source part 221 can be used to emit light to the side of the light-emitting layer 2 away from the driving substrate 1. In some embodiments of the present disclosure, the light source part 221 may be a top-emission OLED light-emitting device, which may include a first rear electrode 2211, a rear light-emitting functional layer 2212, and a second rear electrode 2211 which are stacked in sequence in the direction away from the driving substrate 1. The first rear electrode 2211 includes reflective material, and the second back electrode 2213 includes transparent material. The rear light-emitting functional layer 2212 may include a hole injection layer, a hole transport layer, a light-emitting material layer, an electron transport layer, and an electron injection layer sequentially stacked in a direction away from the driving substrate 1. The second rear electrode 2213 includes transparent material.

The light extracting part 222 can be a light-transmitting structure, and it may also have a photoluminescent layer 2221. In some embodiments of the present disclosure, a part of the light extracting part 222 of the rear light-emitting unit 22 has a photoluminescent layer 2221. For example, the material of the photoluminescent layer 2221 may include quantum dot material. Another part of the light extracting part 222 of the rear light-emitting unit 22 has a light-transmitting structure. The photoluminescent layer 2221 can emit light under the excitation of the light of a first color.

As shown in FIGS. 1 and 3, further, the light source part 221 can emit light of the first color. The rear light-emitting unit 22 may include a first rear light-emitting unit 22a, a second rear light-emitting unit 22b, and a third rear light-emitting unit 22c. The light extracting part 222 of the first rear light-emitting unit 22a is a light-transmitting structure, and the light extracting part 222 of the second rear light-emitting unit 22b and the light extracting part 222 of the third rear light-emitting unit 22c both include a photoluminescent layer 2221 that can be excited by the light of the first color to emit light. In addition, the photoluminescent layer 2221 of the light extracting part 222 of the second rear light-emitting unit 22b can emit light of the second color under the excitation of the light of the first color. The photoluminescent layer 2221 of the light extracting part 222 of the third rear light-emitting unit 22c can emit light of the third color under the excitation of the light of the first color. In one example, the first color may be blue, the second color may be red, and the third color may be green.

The rear light-emitting unit 22 can be used as a sub-pixel, and all the back light-emitting units 22 can be classified into a plurality of pixels. Each pixel includes three sub-pixels, namely three rear light-emitting units 22, which are the first rear light-emitting unit 22a, the second rear light-emitting unit 22b, and the third rear light-emitting unit 22c, respectively.

As shown in FIGS. 1 and 3, in some embodiment of the present disclosure, the light source part 221 and the front light-emitting unit 21 may be simultaneously formed through the same process, to simplify the process. Specifically, the light-emitting layer 2 includes a first electrode layer 201, a pixel defining layer 202, a light-emitting functional layer 203, and a second electrode layer 204.

The first electrode layer 201 is disposed on one side of the driving substrate 1. The first electrode layer 201 is made of reflective material and includes a first front electrode 211 and a first rear electrode 2211. The photoluminescent layer 2221 and the first electrode layer 201 are disposed in the same layer, while the photoluminescent layer 2221 and the first electrode layer 201 may be formed by different processes. For example, the first electrode layer 201 may be formed through a mask process or other processes. The material of the photoluminescent layer 2221 includes quantum dot material, and the photoluminescent layer 2221 can be formed by using an inkjet printing process. Alternatively, the quantum dot material can also be added to the photoresist, and the photoluminescent layer 2221 can be formed by processes such as coating, exposure, and development. The process of the photoluminescent layer 2221 is not particularly limited here.

The pixel defining layer 202 and the first electrode layer 201 are disposed on the same side of the driving substrate 1, and expose the first front electrode 211, the first rear electrode 2211, and the photoluminescence layer 2221. A through hole 2021 is formed in the pixel defining layer 202 in a region corresponding to the light extraction part 222 of the first rear light-emitting unit 22a, and the driving substrate 1 is exposed at the position of the through hole 2021. The pixel defining layer 202 may be used to define the front light-emitting unit 21 and the rear light-emitting unit 22.

The light-emitting functional layer 203 overlaps the first electrode layer 201 and includes a front light-emitting functional layer 212 and a rear light-emitting functional layer 2212. The structure and arrangement of the front light-emitting functional layer 212 and the rear light-emitting functional layer 2212 have been described above. The detailed description is omitted here.

The second electrode layer 204 overlaps the light-emitting functional layer 203, the first electrode layer 201, and the photoluminescent layer 2221, and extends into the through hole 2021 and overlaps the bottom and sidewalls of the through hole 2021. The second electrode layer 204 includes a second front electrode 213 and a second rear electrode 2213. That is to say, the second front electrode 213 of the front light-emitting unit 21 and the second rear electrode 2213 of the light source part 221 are different regions of the second electrode layer 204. That is, the front light-emitting unit 21 and the light source part 221 share the same second electrode layer 204, so that the process can be simplified. Meanwhile, the second electrode layer 204 includes transparent material, and it can be a single-layer or multi-layer structure.

As shown in FIGS. 1 and 3, the light guide layer 3 may be located on the side of the light-emitting layer 2 away from the driving substrate 1, and the light guide layer 3 includes a plurality of light guide parts 31. Each light guide part 31 is disposed in a one-to-one correspondence with each rear light-emitting unit 22. That is, the orthographic projection of each light guide part 31 on the driving substrate 1 at least partially overlaps with its corresponding rear light-emitting unit 22. Each light guide part 31 can guide the light emitted by the corresponding light source part 221 of the rear light-emitting unit 22 to the light extracting part 222, so that the light extracting part 222 emits light to the driving substrate 1. Since the driving substrate 1 is a light-transmitting structure, light can be emitted to the side of the driving substrate 1 away from the light-emitting layer 2 through the driving substrate 1, so that the display panel can perform double-sided display.

The structure of the light guide layer 3 will be exemplified below.

As shown in FIG. 1, in some embodiments of the present disclosure, in each of the rear light-emitting units 22, the light source part 221, and the light extracting part 222 are arranged at intervals. That is, the light source part 221 and the light extracting part 222 are not in direct contact with each other. The orthographic projection of each light guide part 31 on the driving substrate 1 is located between the light source part 221 and the light extracting part 222 of the corresponding rear light-emitting unit 22, so as to avoid blocking the light source part 221 and the light extracting part 222, and allow at least a part of the light emitted by the light source part 221 to be incident to the light guide part 31 and be guided to the light extracting part 222 by the light guide part 31.

The light guide layer 3 may include multiple layers of first refractive layers 301 sequentially distributed along a direction away from the driving substrate 1. A second refractive layer 302 is attached between two adjacent first refractive layers 301. That is, each of the second refractive layers 302 is in direct contact with the adjacent first refractive layers 301 on both sides. Both the first refractive layer 301 and the second refractive layer 302 are made of transparent material. Meanwhile, the orthographic projections of the first refractive layer 301 and the second refractive layer 302 on the driving substrate 1 are completely coincident.

In order to enable the light entering the light guide layer 3 to be directed to the light extracting part 222, the light can be totally reflected in the light guide layer 3 by making the refractive indices of the first refractive layer 301 and the second refractive layer 302 meet a preset condition, such that the light entering the light guide layer 3 will not be emitted to the side away from the driving substrate 1. The preset condition is: the ratio of the refractive index of the second refractive layer 302 to the refractive index of the first refractive layer 301 is not less than $\sqrt{2}$.

In some embodiments of the present disclosure, the refractive indices of the respective first refractive layers 301 are the same. The material of the first refractive layer 301 includes at least one of LiF and $AlF_3$, and the material of the second refractive layer 302 includes at least one of $MoO_3$ and ZnS. Of course, in other embodiments of the present disclosure, the first refractive layer 301 and the second refractive layer 302 may include other materials, which will not be listed here.

For the light source part 221 and the light extracting part 222 of the same rear light-emitting unit 22, at least part of the light emitted by the light source part 221 will enter the second refraction layer 302 through the end surface of the second refraction layer 302 close to the light source part 221, be total reflected multiple times at the contact interface between the second refraction layer 302 and the first refraction layer 301, and exit from the end surface of the second refraction layer 302 close to the light extracting part 222. At least part of the exited light will be irradiated to the light extracting part 222. Accordingly, at least part of the light emitted by the light source part 221 can be guided to the light extracting part 222.

In some embodiments of the present disclosure, the number of the first refractive layers 301 may be two, and correspondingly, the number of the second refractive layers 302 is one. Of course, in other embodiments of the present disclosure, the first refractive layer 301 may also be three or more layers, and a second refractive layer 302 is disposed between every two adjacent first refractive layers 301. Therefore, the light emitted by the light source part 221 can be guided through the multilayered second refraction layers 302, and the utilization rate of the light can be improved.

The derivation process of the above-mentioned preset condition is described below in conjunction with FIG. 2.

Figure 2:
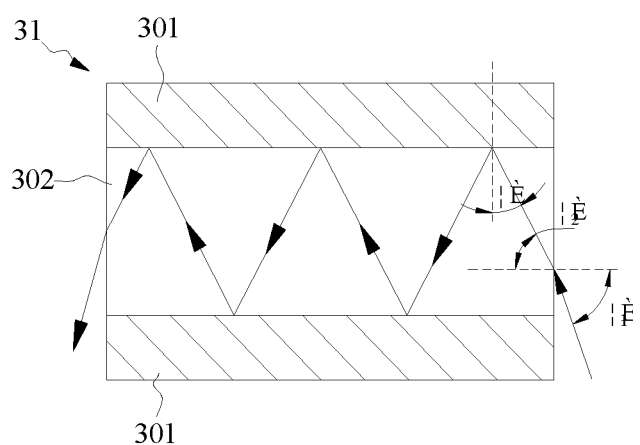
FIG. 2 is an optical path diagram of the light guide part of the display panel of FIG. 1.

The light path of the light emitted by the light source part 221 entering the light guide layer 3 is shown in FIG. 2. It is assumed that the incident angle of the light entering the second refracting layer 302 is $\theta_1$ and the refraction angle is $\theta_2$. Then, when the refracted light is reflected at the contact interface between the second refracting layer 302 and the first refracting layer 301 on the side of the second refracting layer 302 facing away from the driving substrate 1, the incident angle is $\theta$.

It can be known from the law of refraction:

$$\frac{n_2}{n_1} = \frac{\sin\theta 1}{\sin\theta 2},$$

wherein $$\frac{n_2}{n_1}$$

is the relative refractive index of the second refractive layer 302 relative to the first refractive layer 301, and the relative refractive index may be represented by $n_{21}$.

According to the condition of total reflection, total reflection will only occur when $\theta \geq C$ (critical angle of total reflection), we can get:

$\theta_{min}=90°-\theta_{2max} \geq C$, wherein $\theta_{min}$ is the minimum value of the incident angle $\theta$, $\theta_{2max}$ is the maximum value of the refraction angle $\theta_2$.

The refraction angle $\theta_{2max}=C$, therefore, $\theta_{1max}=90°$, and $\theta_{1max}$ is the maximum value of the incident angle $\theta_1$.

$\cos\theta_{min} = \sin\theta_{2max} \leq \cos C$, that is, $\sin C \leq \cos C$, and $$\sin C = \frac{1}{n_{21}},$$

therefore, it can be concluded that $$\frac{1}{n_{21}} \leq \sqrt{1 - \frac{1}{n_{21}^2}},$$

that is, $n_{21} \geq \sqrt{2}$.

Further, as shown in FIG. 1, the display panel further includes an encapsulation layer 4 and a light shielding layer 5.

The encapsulation layer 4 may cover the light guide layer 3 and the light-emitting layer 2, and the encapsulation layer 4 may be a single-layer or multi-layer structure. For example, the encapsulation layer 4 may include two inorganic layers and an organic layer between the two inorganic layers, and the structure of the encapsulation layer 4 is not particularly limited herein.

The light shielding layer 5 can be disposed on the surface of the encapsulation layer 4 away from the driving substrate 1, and the light shielding layer 5 includes a plurality of light shielding parts 51. The material of the light shielding part 51 may include resin, metal, or other materials, as long as it does not transmit light, which is not particularly limited here. At the same time, each of the rear light-emitting units 22 is located within the orthographic projection of each light-shielding part 51 on the driving substrate 1 in a one-to-one correspondence. Therefore, each rear light-emitting unit 22 can be shielded from the side of the light-emitting layer 2 away from the driving substrate 1 by the light-shielding part 51, so as to prevent the light emitted by the light source part 221 of the rear light-emitting unit 22 from being emitted to the side of the light-emitting layer 2 away from the driving substrate 1, and to prevent interference to the image displayed by the front light-emitting unit 21.

In addition, in order to avoid blocking the front light-emitting unit 21, the front light-emitting unit 21 can be located outside the orthographic projection of each light shielding part 51 on the driving substrate 1, such that light emitted from the front light-emitting unit 21 can be emitted from regions other than the light shielding part 51.

As shown in FIG. 3, in some embodiments of the present disclosure, the light guide layer 3 is not in direct contact with the light-emitting layer 2. The light guide layer 3 may be disposed on the surface of the light-emitting layer 2 away from the driving substrate 1. At the same time, the display panel further includes a cover plate 6, which is made of transparent material and is disposed on the side of the light-emitting layer 2 away from the driving substrate 1. The cover plate 6 may play the role of encapsulation and protection.

The light guide layer 3 is disposed on the surface of the cover plate 6 close to the driving substrate 1. Each light guide part 31 has a light guide groove 300 that expands toward the corresponding back light-emitting unit 22. The light guide groove 300 has a first groove wall 310 and a second groove wall 320 that reflect light. The first groove wall 310 and the second groove wall 320 are disposed opposite to each other. The first groove wall 310 can reflect at least part of the light emitted by the light source part 221 to the second groove wall 320. The second groove wall 320 can reflect at least part of the light from the first groove wall 310 to the light extracting part 222. Thus, at least part of the light emitted by the light source part 221 is guided to the light extracting part 222 so as to exit light to the side of the driving substrate 1 away from the light-emitting layer 2.

Further, as shown in FIG. 3, the light guide groove 300 may be a V-shaped groove. The first groove wall 310 and the second groove wall 320 are both planar structures. The angle $\alpha$ between the first groove wall 310 and the cover plate 6 and the angle $\beta$ between the second groove wall 320 and the cover plate 6 are both 45°, and the included angle between the first groove wall 310 and the second groove wall 320 is 90°, so as to guide the light toward the light extracting part 222. Meanwhile, the light source part 221 is located in the orthographic projection of the first groove wall 310 on the driving substrate 1, and is located outside the orthographic projection of the second groove wall 320 on the driving substrate 1. The light emitted by the light source part 221 is irradiated on the first groove wall 310 as much as possible. The light extracting part 222 is located within the orthographic projection of the second groove wall 320 on the driving substrate 1, and is located outside the orthographic projection of the first groove wall 310 on the driving substrate 1, so as to receive the light reflected by the first groove wall 310 as much as possible, and irradiate the light reflected by the second groove wall 320 to the light extracting part 222 as much as possible.

In this embodiment, the light guide part 31 may be a single-layer structure of a light-reflecting material, and may be a multi-layer structure. For example, as shown in FIGS. 3 and 4, each light guide part 31 includes a support layer 330 and a light reflection layer 340.

Figure 4:
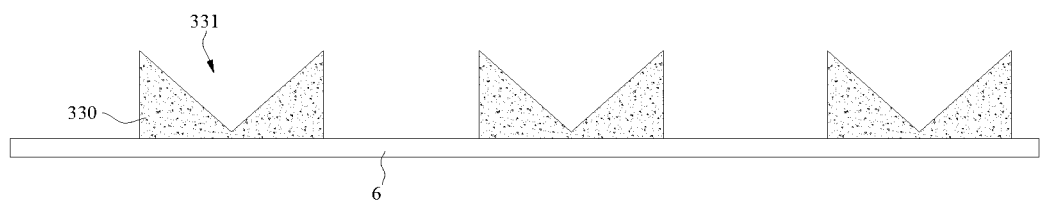
FIG. 4 is a schematic diagram of the support layer of the display panel of FIG. 3.

As shown in FIG. 4, the support layer 330 is disposed on the surface of the cover plate 6 close to the light-emitting layer 2, and has a groove 331 extending toward the rear light-emitting unit 22 corresponding to the light guide part 31 of the support layer 330. The material of the support layer 330 may include resin, which may be formed by processes such as coating, step exposure, developing, and baking. Of course, other materials and processes can also be used for the support layer 330 as long as the grooves 331 can be formed.

Further, in order to facilitate the formation of the light guide groove 300, the included angle between each of the two side walls of the groove 331 and the cover plate 6 may be 45°, and the included angle between the two side walls is 90°.

The light-reflecting layer 340 covers the two sidewalls of the groove 331, so that the light-guiding groove 300 is defined by the light-reflecting layer 340. The reflective layer 340 corresponding to the light source part 221 is used to form the first groove wall 310, and the reflective layer 340 corresponding to the light extracting part 222 is used to form the second groove wall 320. The material of the light-reflecting layer 340 can be metal, such as silver, aluminum, or the like. Of course, it can also be other non-metal materials, as long as it can reflect light.

The supporting layers 330 of each light guide part 31 are disposed in the same layer, and can be formed simultaneously by the same process, and the light-reflecting layers 340 of each light-guiding part 31 can also be formed simultaneously through the same process, thereby simplifying the process.

Embodiments of the present disclosure further provide a display device including the display panel of any of the foregoing embodiments. The specific structure and beneficial effects of the display panel have been described in detail in the embodiments of the display panel above, and will not be repeated here. The display device may be a mobile phone, a tablet computer, a TV, etc., which is not particularly limited here.

Other embodiments of the present disclosure will readily occur to those skilled in the art upon consideration of the specification and practice of the invention disclosed herein. This application is intended to cover any variations, uses, or adaptations of the present disclosure that follow the general principles of the present disclosure and include common knowledge or techniques in the technical field not disclosed by the present disclosure. The specification and examples are to be regarded as exemplary only, with the true scope and spirit of the disclosure being indicated by the appended claims.

What is claimed is:

1. A display panel comprising:
a driving substrate having a light-transmitting structure;
a light-emitting layer disposed at a side of the driving substrate and comprising a plurality of front light-emitting units and a plurality of rear light-emitting units, wherein each rear light-emitting unit comprises a light source part and a light extracting part, and the front light-emitting units and the light source part are configured to emit light to a side away from the driving substrate; and
a light guide layer disposed at a side of the light-emitting layer away from the driving substrate and comprising a plurality of light guide parts, wherein each light guide part is disposed in a one-to-one correspondence with each rear light-emitting unit, and each light guide part is configured to guide light emitted by the light source part of corresponding rear light-emitting unit to the light extracting part, to extract light to the driving substrate by the light extracting part,
wherein an orthographic projection of the each light guide part on the driving substrate is positioned between the light source part and the light extracting part of the corresponding rear light-emitting unit, and
the light guide layer comprises a plurality of first refractive layers sequentially distributed along a direction away from the driving substrate, and a second refractive layer is attached between two adjacent first refractive layers,
wherein a ratio of a refractive index of the second refractive layer to a refractive index of the first refractive layer is not less than $\sqrt{2}$.

2. The display panel according to claim 1, wherein the light guide layer is disposed on the side of the light-emitting layer away from the driving substrate, and
the display panel further comprises:
an encapsulation layer covering the light guide layer and the light-emitting layer; and
a light shielding layer disposed on a side of the encapsulation layer away from the driving substrate and comprising a plurality of light shielding parts, wherein each rear light-emitting unit is located within an orthographic projection of each light-shielding part on the driving substrate in a one-to-one correspondence, and each front light-emitting unit is located outside the orthographic projection of each light-shielding part on the driving substrate.

3. A display device comprising a display panel according to claim 1.

4. A display panel comprising:
a driving substrate having a light-transmitting structure;
a light-emitting layer disposed at a side of the driving substrate and comprising a plurality of front light-emitting units and a plurality of rear light-emitting units, wherein each rear light-emitting unit comprises a light source part and a light extracting part, and the front light-emitting units and the light source part are configured to emit light to a side away from the driving substrate; and
a light guide layer disposed at a side of the light-emitting layer away from the driving substrate and comprising a plurality of light guide parts, wherein each light guide part is disposed in a one-to-one correspondence with each rear light-emitting unit, and each light guide part is configured to guide light emitted by the light source part of corresponding rear light-emitting unit to the light extracting part, to extract light to the driving substrate by the light extracting part, wherein the display panel further comprises:
a cover plate, disposed at the side of the light-emitting layer away from the driving substrate,
wherein the light guide layer is disposed at a surface of the cover plate close to the driving substrate, and each light guide part comprises a light guide groove extending toward the corresponding rear light-emitting unit, the light guide groove comprises a first groove wall and a second groove wall that are reflective and disposed opposite to each other, the first groove wall is configured to reflect at least part of light emitted by the light-emitting part to the second groove wall, and the second groove wall is configured to reflect at least part of light from the first groove wall to the light extracting part.

5. The display panel according to claim 4, wherein an included angle between the first groove wall and the cover plate and an included angle between the second groove wall and the cover plate are both 45°, the light source part is disposed within an orthographic projection of the first groove wall on the driving substrate while outside an orthographic projection of the second groove wall on the driving substrate, and the light extracting part is disposed within the orthographic projection of the second groove wall on the driving substrate while outside the orthographic projection of the first groove wall on the driving substrate.

6. The display panel according to claim 4, wherein the light guide part comprises:
   a support layer, disposed at a surface of the light-emitting layer close to the cover plate and having a groove extending towards the corresponding rear light-emitting unit; and
   a reflective layer, overlapped on side walls of the groove, and wherein the light guide groove is formed by the reflective layer.

7. A display device comprising a display panel according to claim 4.

8. A display panel comprising:
   a driving substrate having a light-transmitting structure;
   a light-emitting layer disposed at a side of the driving substrate and comprising a plurality of front light-emitting units and a plurality of rear light-emitting units, wherein each rear light-emitting unit comprises a light source part and a light extracting part, and the front light-emitting units and the light source part are configured to emit light to a side away from the driving substrate; and
   a light guide layer disposed at a side of the light-emitting layer away from the driving substrate and comprising a plurality of light guide parts, wherein each light guide part is disposed in a one-to-one correspondence with each rear light-emitting unit, and each light guide part is configured to guide light emitted by the light source part of corresponding rear light-emitting unit to the light extracting part, to extract light to the driving substrate by the light extracting part, wherein:
   the light source is configured to emit light of a first color, and the rear light-emitting units comprises a first rear light-emitting unit, a second rear light-emitting unit and a third rear light-emitting unit; and
   the light extracting part of the first rear light-emitting unit is in a light-transmitting structure, and the light extracting part of the second rear light-emitting unit and the light extracting part of the third rear light-emitting unit both include a photoluminescent layer excitable by the by the light of the first color to emit light, and the light emitted by the photoluminescent layer of the second rear light-emitting unit and the light emitted by the photoluminescent layer of the third rear light-emitting unit have different colors.

9. The display panel according to claim 8, wherein:
   each front light-emitting unit comprises a first front electrode, a front light-emitting functional layer, and a second front electrode sequentially stacked in a direction away from the driving substrate;
   each rear light-emitting unit comprises a first rear electrode, a rear light-emitting functional layer, and a second rear electrode stacked in sequence in the direction away from the driving substrate, wherein the first front electrode and the first rear electrode are reflective, and the second front electrode and the second rear electrode are transitive, and
   wherein the light-emitting layer comprises:
   a first electrode layer disposed on a same side of the driving substrate as the photoluminescent layer, wherein the first electrode is reflective and comprises the first front electrode and the first rear electrode;
   a pixel defining layer disposed on a same side of the driving substrate as the first electrode layer and exposing the first front electrode, the first rear electrode, and the photoluminescent layer, wherein the a through hole is formed in the pixel defining layer at an area corresponding to the first rear light-emitting unit;
   a light-emitting functional layer overlapped on the first electrode layer and the pixel defining layer and comprising the front light-emitting functional layer and the rear light-emitting functional layer; and
   a second electrode layer overlapped on the light-emitting functional layer, the first electrode layer and the photoluminescent layer and extended into the through hole, wherein the second electrode layer is transitive and comprising the second front electrode and the second rear electrode.

10. The display panel according to claim 8, wherein the photoluminescent layer comprises quantum dot material.

11. A display device comprising a display panel according to claim 8.

* * * * *